US009297884B1

(12) United States Patent
Nelson

(10) Patent No.: US 9,297,884 B1
(45) Date of Patent: Mar. 29, 2016

(54) SYSTEMS AND METHODS OF FREQUENCY ESTIMATION FOR GEOLOCATION

(71) Applicant: The United States of America as represented by the Director, National Security Agency, Washington, DC (US)

(72) Inventor: Douglas J. Nelson, Columbia, MD (US)

(73) Assignee: The United States of America as represented by the Director, National Security Agency, Washington, DC (US)

( * ) Notice: Subject to any disclaimer, the term of this patent is extended or adjusted under 35 U.S.C. 154(b) by 191 days.

(21) Appl. No.: 14/120,658

(22) Filed: May 20, 2014

Related U.S. Application Data

(60) Provisional application No. 61/997,933, filed on Apr. 30, 2014.

(51) Int. Cl.
*H04B 17/00* (2015.01)
*G01S 5/06* (2006.01)

(52) U.S. Cl.
CPC .......................................... *G01S 5/06* (2013.01)

(58) Field of Classification Search
CPC ................................ H04B 17/00; H04L 27/06
USPC ................... 455/227, 226.1; 375/316, 320
See application file for complete search history.

(56) References Cited

U.S. PATENT DOCUMENTS 7,444,128 B1 * 10/2008 Nelson ............... H04L 27/0014
375/316
8,275,077 B1 * 9/2012 Nelson ............... H04L 27/2278
375/262

OTHER PUBLICATIONS

Nelson, D. et al.; A channelized cross spectral method for improved freq. resolution; Time-Freq. & Time-Scale Analysis; Proc of IEEE-SP Int'l Symp.; pp. 101-104; 1998; IEEE; USA.
Nelson, D. et al.; A generalized cross-ambiguity function for geolocation; CSS '07 Proc. of the 5th IASTED Int'l Conf on Circuits, Signals & Systems; pp. 239-244, ACTA Press;USA.
Nelson, D.; Special purpose correlation functions for improved signal detection and parameter estimation; Acoustics, Speech & Sig Processing ICASSP-93; pp. 73-76 vol. 4; IEEE;USA.
Nelson, D. et al.; Target location from the estimated instantaneous received frequency; SPIE Proceedings, vol. 8020; ISR Detection and Tracking II; 2011; Orlando, USA.

* cited by examiner

*Primary Examiner* — Sharad Rampuria
*Assistant Examiner* — Farideh Madani

(57) ABSTRACT

A method includes computing a cross-spectral surface of a signal. The method further includes determining initial frequency estimates to be points on the cross-spectral surface. The method further includes performing a polynomial interpolation to generate an initial frequency polynomial. The method further includes integrating the initial frequency polynomial to generate an initial phase polynomial. The method further includes processing the signal to generate a basebanded signal. The method further includes determining unwrapped phase values of the basebanded signal. The method further includes performing a second polynomial interpolation to generate a residual phase polynomial. The method further includes generating an updated phase polynomial based on the initial phase polynomial and the residual phase polynomial. The method further includes differentiating the updated phase polynomial to generate a polynomial approximation of the time-varying carrier frequency of the received signal.

20 Claims, 16 Drawing Sheets

SYSTEMS AND METHODS OF FREQUENCY ESTIMATION FOR GEOLOCATION

CROSS REFERENCE TO RELATED APPLICATIONS

This application claims priority to provisional patent application Ser. No. 61/997,933, filed Apr. 30, 2014, titled "Systems and Methods of Frequency Estimation for Geolocation," naming Douglas J. Nelson as sole inventor, the contents of which are hereby incorporated by reference herein in their entirety.

FIELD OF THE INVENTION

The present invention relates generally to signal processing, and in particular to estimation of a received signal frequency and geolocation of the emitter.

BACKGROUND

The ability to locate the source of an electromagnetic transmission is well studied and has several interesting applications. In the battle field radar problem, the radar's goal is to locate and track the target, and the target's goal is to locate and avoid the radar. In search and rescue, the goal of the search team is to locate the source of a rescue beacon or emergency transmission. Previous attempts at performing geolocation of an emitter transmitting an electromagnetic signal have been based on analyzing Doppler characteristics of the transmitted signal, generally as observed by two or more independent receivers. In many cases, some amount of a priori knowledge of the location of the emitter and/or the transmitted frequency of the emitter was required. The accuracy of previously tried geolocation techniques tended to depend on the accuracy with which characteristics of the transmitted signal and the received signal could be determined, including the frequency and phase. Accordingly, there is a need for methods and systems to provide improved frequency and phase estimation.

SUMMARY

One embodiment of the present invention is a method of generating a polynomial approximation of a time-varying carrier frequency of a received signal. The method includes computing a cross-spectral surface of the received signal. The cross-spectral surface is a function of at least time and frequency. The method further includes for each of a first series of times, determining an initial frequency estimate to be a point on the cross-spectral surface. The method further includes performing a first polynomial interpolation based on the initial frequency estimates to generate an initial frequency polynomial. The method further includes integrating the initial frequency polynomial to generate an initial phase polynomial. The method further includes processing the received signal to generate a basebanded signal using the initial phase polynomial. The method further includes for each of a second series of times, determining an unwrapped phase value of the basebanded signal. The method further includes performing a second polynomial interpolation based on the unwrapped phase values to generate a residual phase polynomial. The method further includes generating an updated phase polynomial based on the initial phase polynomial and the residual phase polynomial. The method further includes differentiating the updated phase polynomial to generate the polynomial approximation of the time-varying carrier frequency of the received signal.

In a related embodiment, the cross-spectral surface of the received signal is a product of a first short time Fourier transform of the received signal and a conjugate of a second short time Fourier transform. The second short time Fourier transform is performed on a signal resulting from delaying the received signal. Each initial frequency estimate may be an argument of a surface component of the cross-spectral surface having a largest magnitude at the time of the first series of times.

In a further related embodiment, a nominally basebanded signal is generated using the received signal and applying a bandpass filter to the nominally basebanded signal to generate the basebanded signal. In a further related embodiment, the method also includes performing an iterated phase estimation. The updated phase polynomial generated in a first iteration is used as the initial phase polynomial of a second iteration.

In a further related embodiment, the method includes receiving the signal from the emitter at a moving receiver, generating the polynomial approximation of the time-varying carrier frequency of the received signal, and geolocating the emitter based on the approximated frequency of the received signal.

Alternatively, or in addition, geolocating the emitter based on the approximated frequency may include solving for a velocity cone angle at a series of observations. The emitter may be geolocated at the intersection of the velocity cones. Geolocating the emitter based on the approximated frequency also may include minimizing an objective function. The objective function may be a variance of the approximated frequency. The objective function also may be a log variance of the approximated frequency.

In a further related embodiment, the method includes integrating the polynomial approximation of the time-varying carrier frequency of the received signal to generate an approximation of a phase of the received signal. Alternatively, or in addition, the method includes calculating a propagation time difference based on the approximation of the phase of the received signal. The method also may include performing geolocation by providing the propagation time difference and a frequency difference estimated from the frequency of the received signal to a geolocation engine.

Another embodiment of the present invention is a method of generating a polynomial approximation of a time-varying carrier frequency of a received signal. The method includes computing a cross-spectral surface of the received signal. The cross-spectral surface is a function of at least time and frequency. The method further includes for each of a first series of times, determining an initial frequency estimate to be a point on the cross-spectral surface. The method further includes performing a first polynomial interpolation based on the initial frequency estimates to generate an initial frequency polynomial. The method further includes integrating the initial frequency polynomial to generate an initial phase polynomial. The method further includes processing the received signal to generate a basebanded signal using the initial phase polynomial. The method further includes computing a cross-product signal. The cross-product signal is a product of the basebanded signal and a complex conjugate of a delayed version of the basebanded signal. The method further includes for each of a second series of times, determining a residual signal frequency value as an argument of the cross-product signal. The method further includes performing a second polynomial interpolation based on the residual signal frequency values to generate a residual signal frequency polynomial. The method further includes generating the polynomial approximation of the time-varying carrier frequency of the received signal based on the initial frequency polynomial and the residual signal frequency polynomial.

DETAILED DESCRIPTION

Figure 1:
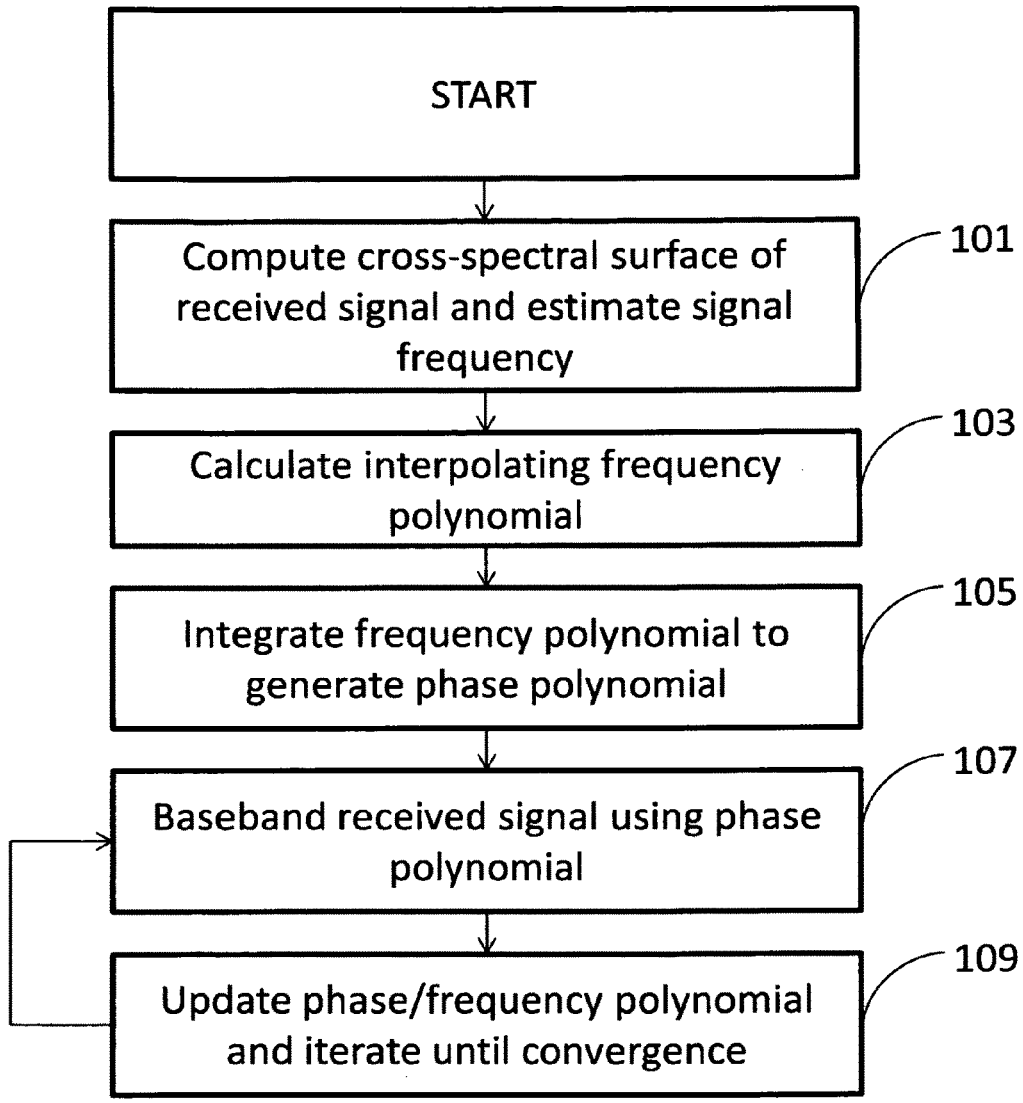
FIG. 1 is a flow chart of a process in accordance with an embodiment of the present invention.

A process in accordance with an embodiment of the present invention is described with reference to FIG. 1. An electromagnetic signal is received by at least one receiver, and the at least one receiver passes the received signal to a computer system for processing to recover the frequency and the phase of the received signal. In some embodiments, the processing also includes determining the geographic location of the emitter that is generating the signal using the recovered frequency and/or the recovered phase. Methods of recovering frequency and phase as disclosed in embodiments of the present invention provide improved speed and accuracy over previous techniques, which in turn can be used to perform faster and more accurate geolocation of the emitter. The examples discussed herein will, unless otherwise specified, assume a single narrowband signal with slowly varying instantaneous frequency. The principles disclosed herein, however, also can be applied with multiple signals, with wideband signals, and with different frequency signatures, and those of ordinary skill in the art will appreciate that the present invention is not limited to the conditions used in the examples.

The process begins at block 101, where the processor computes a cross-spectral surface of the received signal. The cross-spectral surface is computed as the product of the short time Fourier transform (STFT) of the received signal and the conjugate of the STFT of the delayed signal. In one embodiment, the signal may be delayed by one sample. In other embodiments, the signal may be delayed by more samples, e.g., two, three or four samples. Computation of the cross-spectral surface may be in accordance with equations 1 and 2, as follows:

$$S_{W(T,\omega)} = \int s(t)W(t+T)e^{-i\omega t}dt \quad (1)$$

$$\mathfrak{S}_{W(T,w,\epsilon)} = S_W\left(T+\frac{\epsilon}{2}, \omega\right)S_W^*\left(T-\frac{\epsilon}{2}, \omega\right) \quad (2)$$

where equation 1 shows calculation of the STFT of the signal s(t) using the Hanning window function W, and equation 2 shows calculation of the cross-spectral surface. In one exemplary embodiment, signals of approximately 6 second duration may be used, sampled at approximately 60 kHz. The Hanning windowed STFT may be zero filled to 8192 and computed from data segments of length 4096 with an overlap of 2048. In other embodiments, other appropriate implementations of a Hanning window may be used, and/or other types of windows may be used, such as Hamming, Blackwell, prolate-spheroidal or rectangular windows.

The values of the cross-spectral surface are computed at a series of different time values. As in the presently discussed case, the signal consists of a single narrowband frequency component, the signal frequency can be estimated at each time as the argument of the surface component having the largest magnitude at each time. Estimation of the signal frequency may be in accordance with equations 3 and 4, as follows:

$$I(T_n) = \arg\max_{\omega}\{|\mathfrak{S}_w(T_n, \omega, \epsilon)|\} \quad (3)$$

$$\tilde{\omega}(T_n) = arg\{\mathfrak{S}_w(T_n, I(T_n), \epsilon)\} \quad (4)$$

where equation 3 shows calculation of the selected surface components $I(T_n)$ as the frequency ω at which the cross-spectral surface has the largest magnitude, and equation 4 shows calculation of the signal frequency at each time $T_n$ as the argument of the cross-spectral surface for the surface component $I(T_n)$.

The process continues at block 103, where the processor calculates an interpolating frequency polynomial. The frequency polynomial is obtained by performing a LaGrange interpolation to fit a low degree polynomial to the abscissa values $T_n$ and the ordinate values $\omega(T_n)$, thereby approximating the time-varying frequency of the received signal. In one embodiment, the polynomial approximation is a first degree polynomial. In other embodiments, the polynomial approximation may be a higher degree polynomial, e.g., second, third or fourth degree.

The process continues at block 105, where the processor integrates the polynomial generated in block 103 to generate a phase polynomial, thereby approximating the time-varying phase of the received signal.

Figure 4:
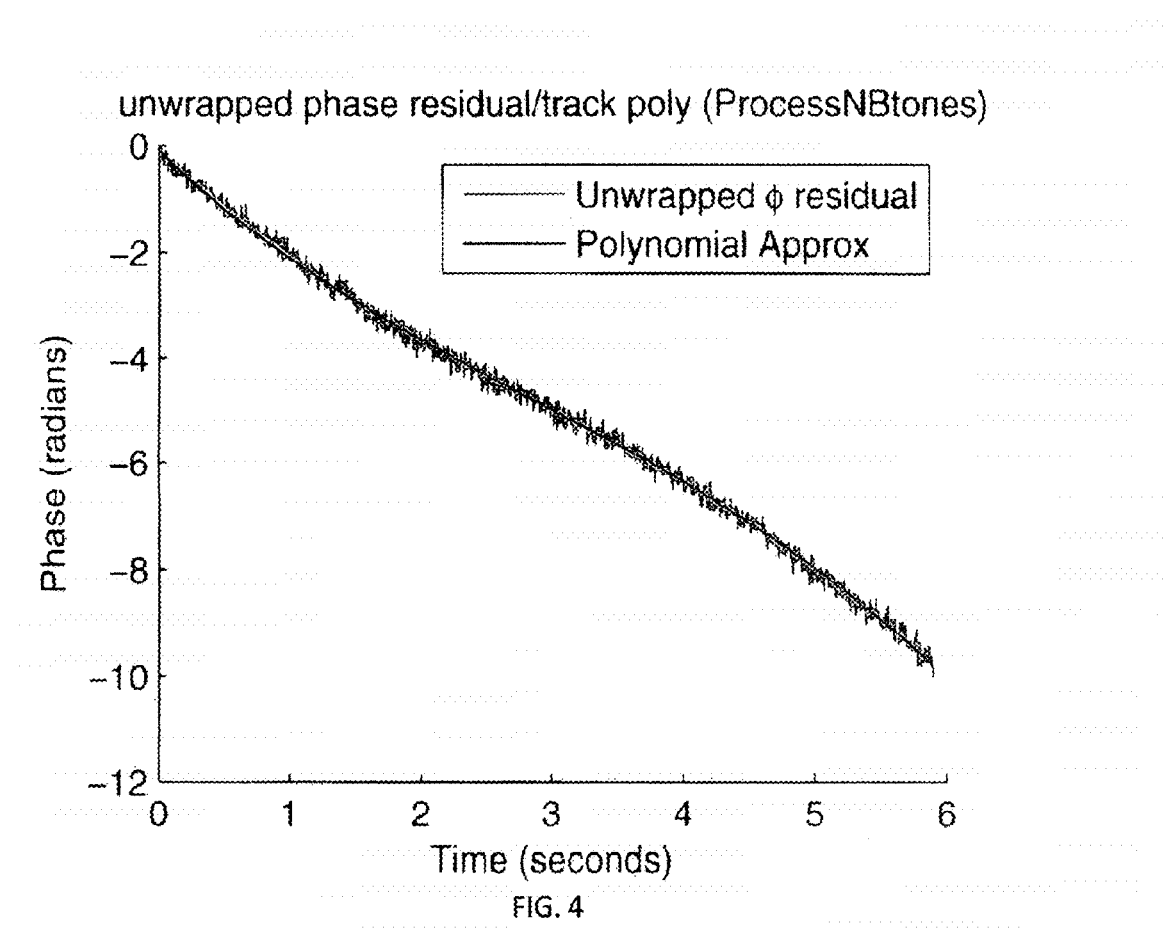
FIGS. 4 and 5 are graphs showing unwrapped phase of a signal and a polynomial approximation of the unwrapped phase of the signal.

The process continues at block 107, where the processor uses the phase polynomial to baseband the received signal. The polynomial approximation of the phase is evaluated at the same series of time values used previously in block 101 for estimating frequency, and the resulting phase values are used to shift the received signal to nominal baseband. Computation of the nominally basebanded signal may be in accordance with equation 5, as follows:

$$S_B(t) = s(t)e^{-iP_\phi(t)} \quad (5)$$

where equation 5 shows calculation of the nominally basebanded signal $S_B(t)$ using the received signal s(t) and the phase values $P_\phi(t)$ of the instantaneous signal phase polynomial. Experiment has shown that the nominally basebanded signal at this stage may be a reasonable approximation. FIG. 4 shows one example according to an embodiment of the present invention, plotting residual unwrapped phase against time. The phase of the residual signal is tracked with reasonable accuracy by the polynomial approximation as the phase varies over time. In some embodiments, a bandpass filter may be applied to the nominally basebanded signal to reduce noise. As is discussed in further detail below, this nominal basebanding can be further refined in several ways to provide improved accuracy.

The process continues at block 109, where the phase polynomial and the frequency polynomial are updated. The updating and refining of the phase polynomial and the frequency polynomial also may be continued by iterating the updating process. Various implementations of block 109 according to certain embodiments are discussed below with reference to FIGS. 2 and 3.

An implementation of a sub-process of block 109 of FIG. 1 according to an embodiment of the present invention is discussed with reference to FIG. 2. The process begins at block 201, where the processor computes a cross-product signal. The cross-product signal is computed as the product of the basebanded (or "residual") signal and the conjugate of the delayed residual signal. In one embodiment, the signal may be delayed by one sample. In other embodiments, the signal may be delayed by more samples, e.g., two, three or four samples.

The process continues at block 203, where the processor estimates the frequency of the residual signal. The frequency can be estimated by calculating the argument of the cross-product signal.

The process continues at block 205, where the processor calculates an interpolating frequency polynomial. The frequency polynomial is obtained by performing a LaGrange interpolation to fit a low degree polynomial to the abscissa values $T_n$ and the ordinate values $\omega(T_n)$, thereby approximating the time-varying frequency of the residual signal. In one embodiment, the polynomial approximation is a degree five polynomial. In other embodiments, the polynomial approximation may be a higher degree polynomial, e.g., sixth, seventh or eighth degree. In other embodiments, the polynomial approximation may be a lower degree polynomial, e.g., degree four, three or two.

Figure 2:
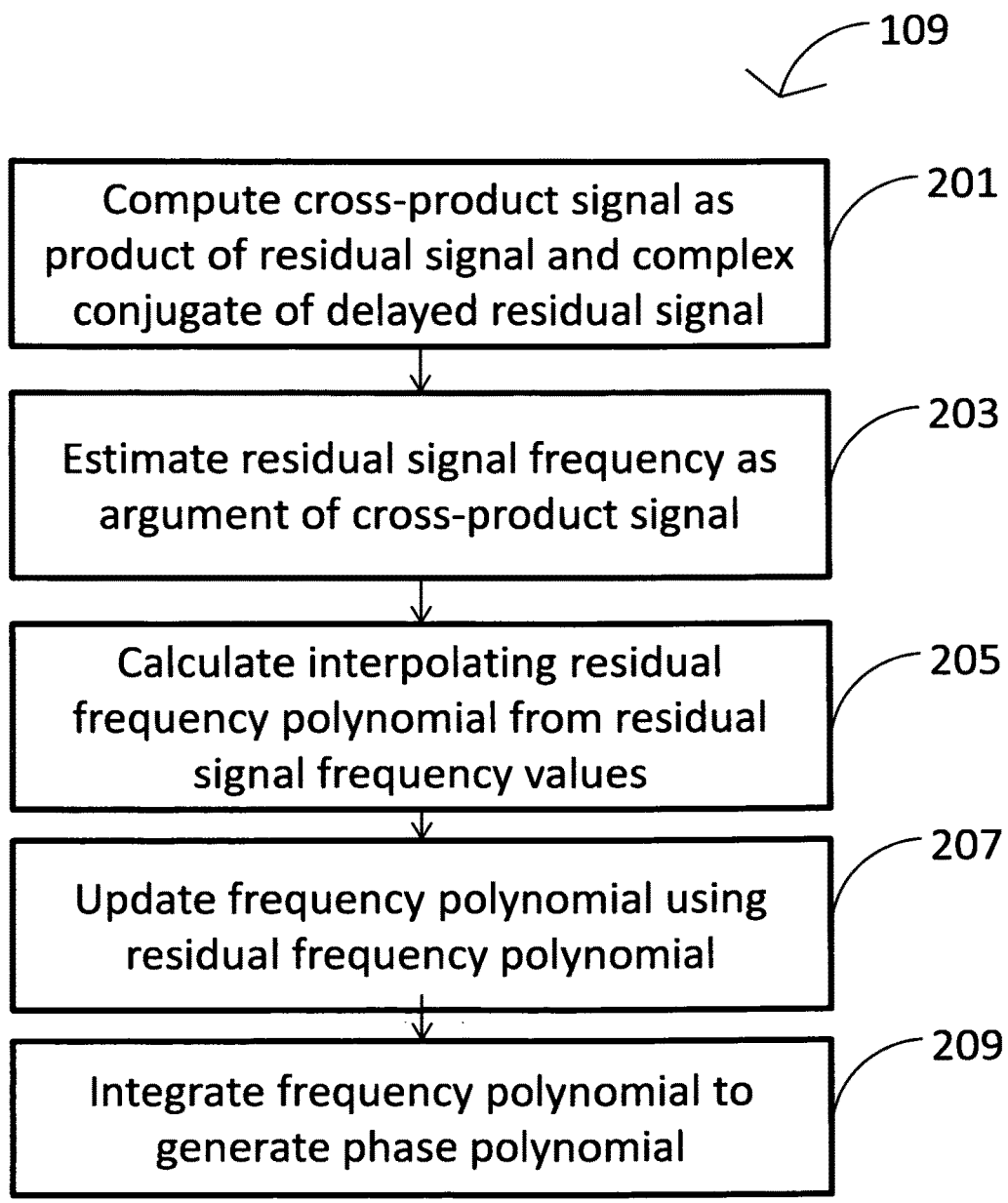
FIG. 2 is a flow chart of a sub-process of the process of FIG. 1 in accordance with an embodiment of the present invention.

The process continues at block 207, where the processor updates the frequency polynomial that was generated in block 103 of FIG. 1. The frequency polynomial is updated by adding the residual frequency polynomial, which was calculated in block 205.

The process continues at block 209, where the processor integrates the updated frequency polynomial approximation to generate an updated phase polynomial approximation. As was noted above, the updating and refining of the phase polynomial and the frequency polynomial may be continued by iterating the updating process. The updated phase polynomial generated at block 209 may be used in a second iteration of block 107 of FIG. 1 to baseband the received signal. The basebanded signal thus generated is expected to be a more accurate recovery of the signal than was generated by the first iteration. Accordingly, as the process again returns to block 109, the phase polynomial and the frequency polynomial may be updated as was described above. The processor also may check an end condition to determine whether to continue iterating. For example, a certain predefined number of iterations, such as one (i.e., do not iterate), two or three may be used, or more. Alternatively, or in addition, the results of the iterations may be compared, and if, e.g., the basebanded signal, the updated phase polynomial, and/or the updated frequency polynomial differ in various iterations by less than a predefined distance function, indicating that the iterative process has converged, the iteration process may be terminated.

For example, the iteration process may be terminated if all of the coefficients of the residual phase polynomial or residual frequency polynomial are small, e.g. less than $10^{-6}$. As another example, the iteration process may be terminated if the mean and/or standard deviation of one or more of the frequency and phase of the residual are smaller than a similar predefined value. In many cases, the mean will be very small after the first iteration. Also, in many cases the standard deviation will be less than one Hertz. While various processes as described here and throughout the present disclosure may operate in radians, those of ordinary skill in the art will understand that the same processes may be performed with calculations being done in Hertz, and that values may be converted back and forth according to design preference. To convert to Hertz, the radian value is multiplied by the sample rate divided by $2\pi$.

Figure 3:
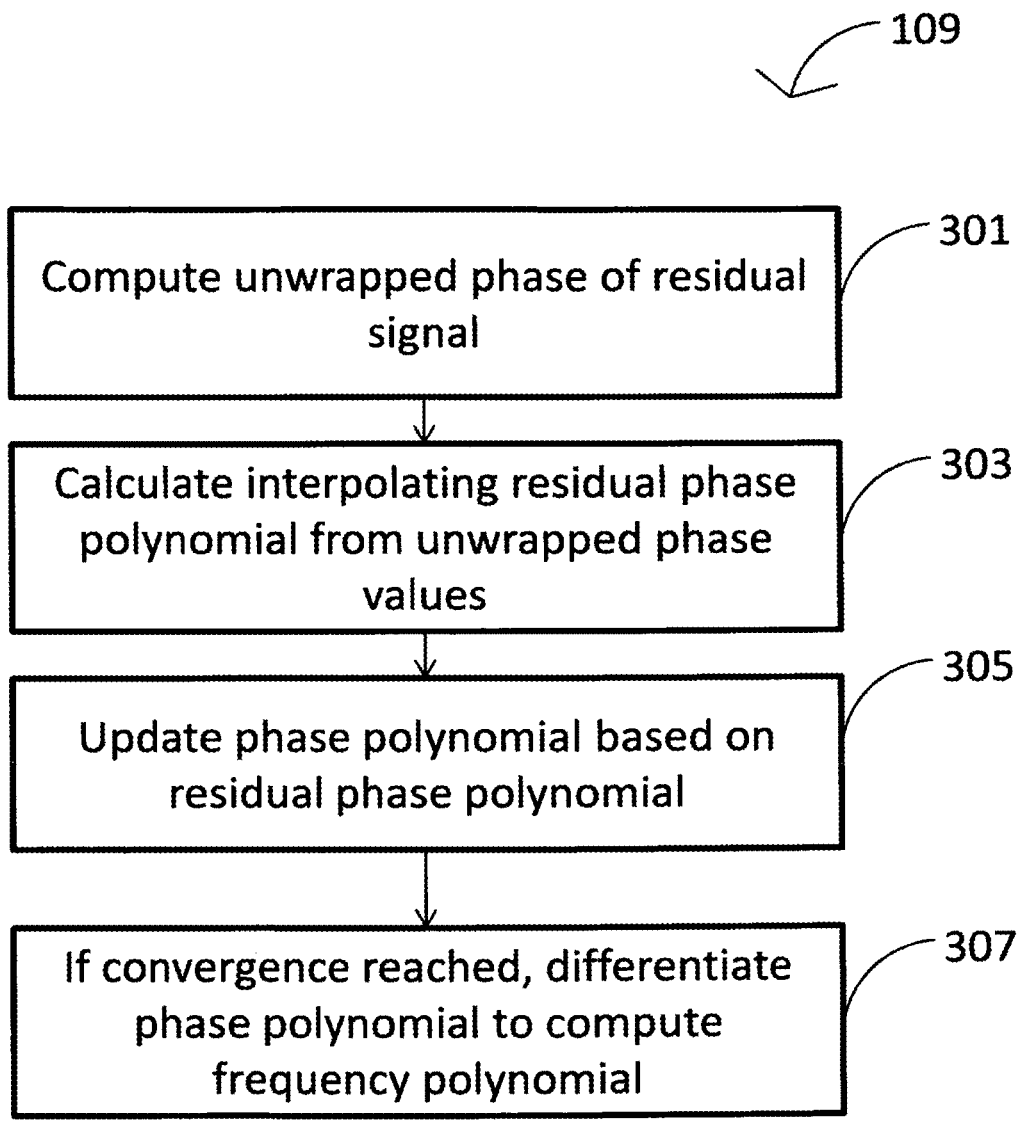
FIG. 3 is a flow chart of a sub-process of the process of FIG. 1 in accordance with an embodiment of the present invention.

An implementation of a sub-process of block 109 of FIG. 1 according to another embodiment of the present invention is discussed with reference to FIG. 3. The process begins at block 301, where the processor computes unwrapped phase values of the residual signal. The unwrapped phase values may be computed as the argument of the residual signal at each of a series of time values. The time values may be the series of time values used in block 101 of FIG. 1. Alternatively, different time values may be used, e.g., a subset of the previously mentioned time values.

The process continues at block 303, where the processor calculates an interpolating residual phase polynomial. The residual phase polynomial is obtained by performing a LaGrange interpolation to fit a low degree polynomial to the abscissa values $T_n$ and the ordinate values $\omega(T_n)$, thereby approximating the time-varying phase of the residual signal. In one embodiment, the polynomial approximation is a first degree polynomial. In other embodiments, the polynomial approximation may be a higher degree polynomial, e.g., degree two, three or four.

The process continues at block 305, where the processor updates the phase polynomial that was generated in block 105 of FIG. 1. The phase polynomial is updated by adding the residual phase polynomial, which was generated in block 303.

Figure 5:
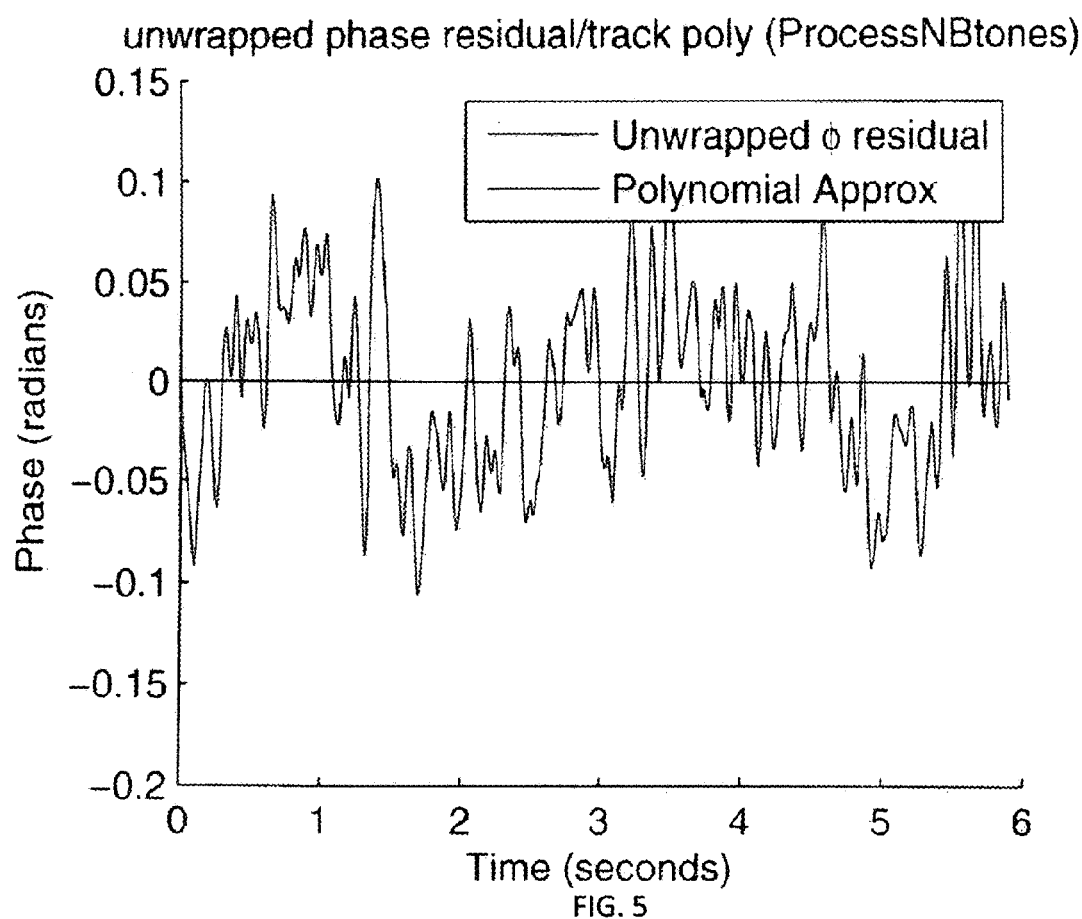

The process continues at block 307. As was noted above, the updating and refining of the phase polynomial and the frequency polynomial may be continued by iterating the updating process. The updated phase polynomial generated at block 305 may be used in a second iteration of block 107 of FIG. 1 to baseband the received signal. The basebanded signal thus generated is expected to be a more accurate recovery of the signal than was generated by the first iteration. FIG. 5 shows one example according to an embodiment of the present invention, plotting residual unwrapped phase against time. In FIG. 5, the process has been through two iterations. The phase of the residual signal is now tracked with greater accuracy than in FIG. 4, as may be seen by noting the greatly reduced scale of the y-axis (phase in radians). Whereas each index mark on the y-axis in FIG. 4 corresponds to a difference of 2 radians, similar index marks in FIG. 5 correspond to a difference of 0.05 radians (i.e., $\frac{1}{40}^{th}$ the scale of FIG. 4). Furthermore, the iterated basebanding of the received signal has led to the phase being centered substantially around zero, in contrast to the phase in FIG. 4, which showed significant drift over time.

Accordingly, as the process again returns to block 109, the phase polynomial and the frequency polynomial may be updated as was described above. The processor also may check an end condition to determine whether to continue iterating. For example, a certain predefined number of iterations, such as one (i.e., do not iterate), two or three may be used, or more. Alternatively, or in addition, the results of the iterations may be compared, and if, e.g., the basebanded signal, the updated phase polynomial, and/or the updated frequency polynomial differ in various iterations by less than a predefined distance function, the iteration process may be terminated.

For example, the iteration process may be terminated if all of the coefficients of the residual phase polynomial or residual frequency polynomial are small, e.g. less than $10^{-6}$. As another example, the iteration process may be terminated if the mean and/or standard deviation of one or more of the frequency and phase of the residual are smaller than a similar predefined value. In many cases, the mean will be very small after the first iteration. Also, in many cases the standard deviation will be less than one Hertz. While various processes as described here and throughout the present disclosure may operate in radians, those of ordinary skill in the art will understand that the same processes may be performed with calculations being done in Hertz, and that values may be converted back and forth according to design preference. To convert to Hertz, the radian value is multiplied by the sample rate divided by $2\pi$.

If the iteration process is terminating due to convergence or another end condition, such as completion of a predetermined number of iterations, or in an embodiment in which iteration does not always occur, the processor differentiates the phase polynomial to compute a frequency polynomial. In some embodiments, the iteration described above in relation to the process of FIG. 3 does not operate on a frequency polynomial directly, but instead operates iteratively only on the phase polynomial. Accordingly, it is not required to calculate an updated frequency polynomial while iteration is still in progress. In other embodiments, however, it may be advantageous to update the frequency polynomial at each iteration, for example, if efficiencies could be realized in computer code implementing the described processes. By updating the frequency polynomial rather than the phase polynomial, phase unwrapping of the residual phase function may be rendered unnecessary.

As described above, embodiments of the present invention have been shown to provide accurate estimates of received signal frequency and phase. In particular, polynomial approximations of received signal frequency and phase can be generated. These polynomials also may be used to calculate estimated values for frequency and phase at times that do not correspond to samples captured by any receiver. For example, instantaneous frequency and phase of a signal at times in between sample points may be estimated with accuracy.

These accurate estimations of frequency and phase also may be used to perform geolocation of the emitter according to various techniques. It is especially noteworthy that, as the processes described above for recovering frequency and phase of the received signal do not require more than a single receiver, geolocation may be performed with a single moving receiver. The techniques described herein are not limited, however, to applications having only a single receiver, and may advantageously be applied to hardware configurations having two receivers, three receivers, a beamforming array of receivers, etc.

For example, the time-varying frequency of the emitter may be recovered based on the recovered received frequency, when the position and velocity of the receiver are known as a function of time. For the purposes of the present discussion, it is assumed that emitter is substantially stationary. The frequency $\omega_e$ of the emitter can thus be recovered from the Doppler equation as shown in equation 6:

$$\omega_e = \frac{c\omega_r(t)}{c - v_r(t)} \quad (6)$$

where $\omega_r$ and $v_r$ are the received frequency and the radial velocity of the receiver with respect to the emitter, respectively, and c is the speed of light.

For a single moving receiver, the locus of possible emitter locations is the surface of a cone symmetric about the velocity vector of the receiver. This velocity cone is defined by 1) the velocity vector of the receiver, which is known, and 2) a cone angle. From an estimate of the emitted frequency, it is possible to solve for the velocity cone angle as shown below in equations 7 and 8:

$$v_r(t) = \frac{V_r(t) \cdot (X_r(t) - x_e)}{\Delta_r(t)} = \frac{V_R(t)\cos\psi_r(t)}{c} \quad (7)$$

$$\psi_r(t) = \cos^{-1}\left\{c\frac{\omega_e - \omega_r(t)}{\omega_e V_R(t)}\right\} \quad (8)$$

where $V_r(t)$ is the velocity vector of the receiver, $X_r(t)$ is the position vector of the receiver, $x_e$ is the position of the emitter, $\Delta_r(t)$ is the distance between the receiver and the emitter, $V_R(t)$ is the scalar speed of the receiver, and $\psi_r(t)$ is the velocity cone angle. While $\omega_e$ may actually be unknown, in many cases a reasonably accurate estimate of $\omega_e$ may be available. For example, the approximate transmitted frequency may be known from published specification data corresponding to a particular device. In other cases, $\omega_e$ may be estimated according to equation 6. The received frequency may be estimated according to the techniques described above, leaving the only unknown on the right-hand side of equation 6 as the radial velocity of the receiver relative to the emitter. By assuming a value of the emitter's geographic location based on a rough estimate (e.g., the emitter is believed to be in a particular city, on a particular mountaintop, etc.), a value for $\omega_e$ may be estimated using equation 6. This estimated value may then be used as herein described to recover a much more accurate estimate of the geographic location of the emitter.

Thus, when estimates of all values of the right hand side of equation 8 are known, estimates of the emitted frequency and received frequency both having been recovered, the velocity cone angle may simply be computed in accordance with equation 8. FIG. 10 shows exemplary data illustrating an estimation of the cone angle that was performed for received signals from 5 seconds of data.

Figure 7B:
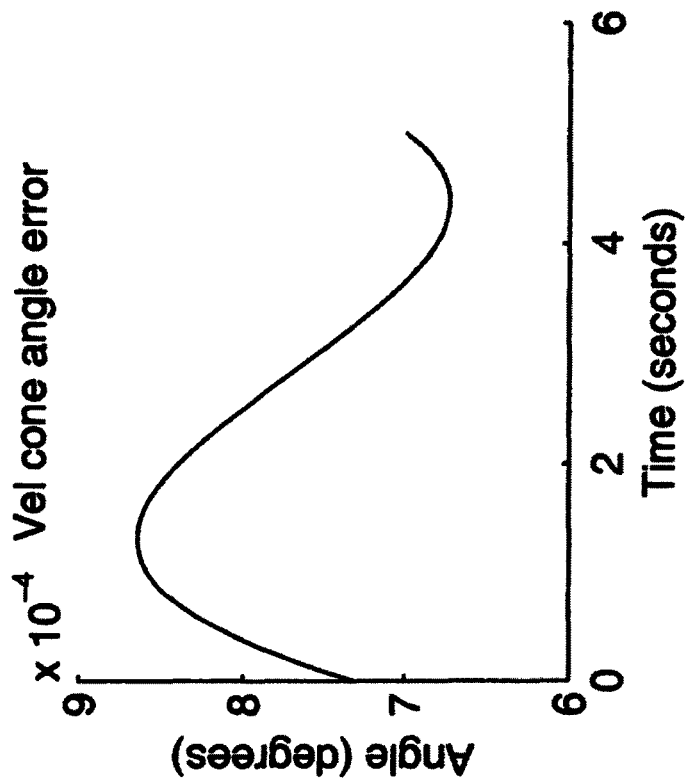
FIGS. 7(a) and 7(b) are graphs showing values of a cone angle and associated error.
Figure 7A:
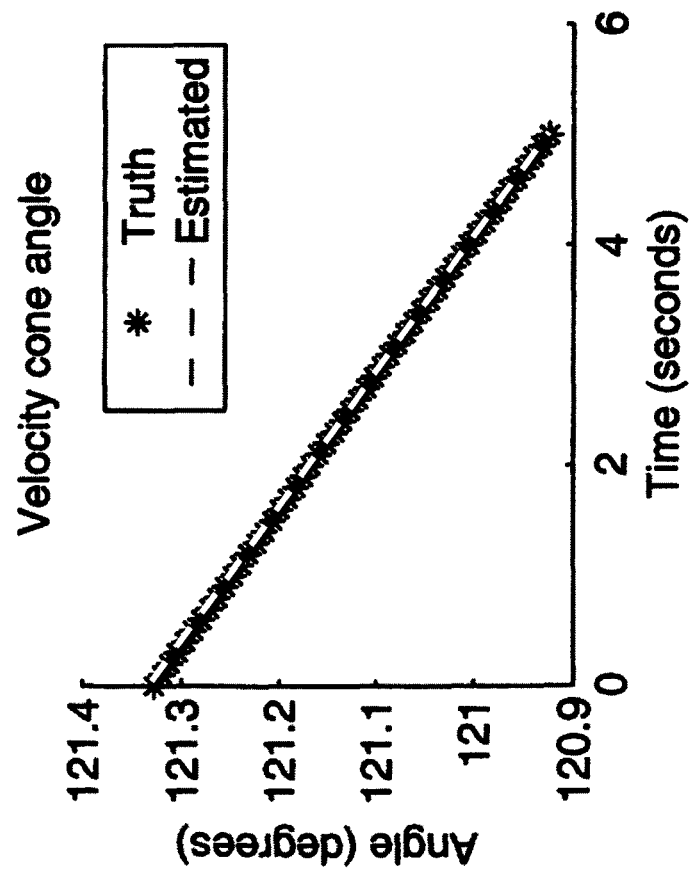

Furthermore, knowing the transmitted frequency, we may solve for the velocity cone angle at a series of observations. The intersection of each cone with the surface of the earth results in a curve on the earth containing the transmitter location. From several observations, the emitter location may be estimated as the intersection of the cone-angle-derived curves. In FIG. 7(a), the graph shows that the true angle of the velocity cone is substantially equal to the estimated angle of the velocity cone. In FIG. 7(b), the observed error is shown as a function of time.

As another example, having estimated the transmitted frequency as a function of time and potential emitter location, the emitter location may be recovered by minimizing an objective function, such as the log variance of the estimated transmitted frequency. A grid of possible emitter locations may be assumed, and the grid point associated with the smallest value of the objective function, e.g., log variance, may be determined to be the emitter location. In some cases, it also may be advantageous to perform an iterative search in this fashion. An initial grid may be selected for search where the grid points are far apart. In some embodiments, the initial grid may cover the entire area from which the receiver can detect signals, while in other embodiments a small area may be selected. Having found the point on the initial grid that minimizes the objective function, a second grid, having a smaller distance between grid points, may be mapped over an area corresponding to that point on the initial grid. This recursive process may be repeated again as necessary to recover the estimated emitter location.

In other embodiments other objective functions may be used, such as variance of the estimated transmitted frequency or cone angle error. In other cases, the emitter location may be recovered by maximizing an objective function. In further embodiments, the emitter location may be recovered by solving for the intersection of velocity cones at multiple observation times.

For each received signal and observation time, an estimated transmitted frequency may be calculated based on equation 6, above. The estimated emitter location may be obtained from several observations as the location for which the objective function is minimized. A representation of geolocation using this technique is depicted in FIG. 8, where the signal received frequency was 7.5 MHz and the receiver altitude was 10,000 feet with an airspeed of 150 mph and 60 seconds of integration time. In this example, the log variance was used instead of the variance to produce a sharp cusp in the variance surface. The example shown in FIG. 8 was performed according to an embodiment using a single receiver as depicted in FIGS. 8(d), 8(e), 8(g) and 8(h), and according to an embodiment using two receivers, as depicted in FIGS. 8(f) and 8(i). This technique is not limited to being performed with a specific number of receivers. The combination of observations from multiple receivers provides for increased accuracy, whereas in some cases the simplicity of implementation provided by a single-receiver configuration may be preferred.

Figure 8A:
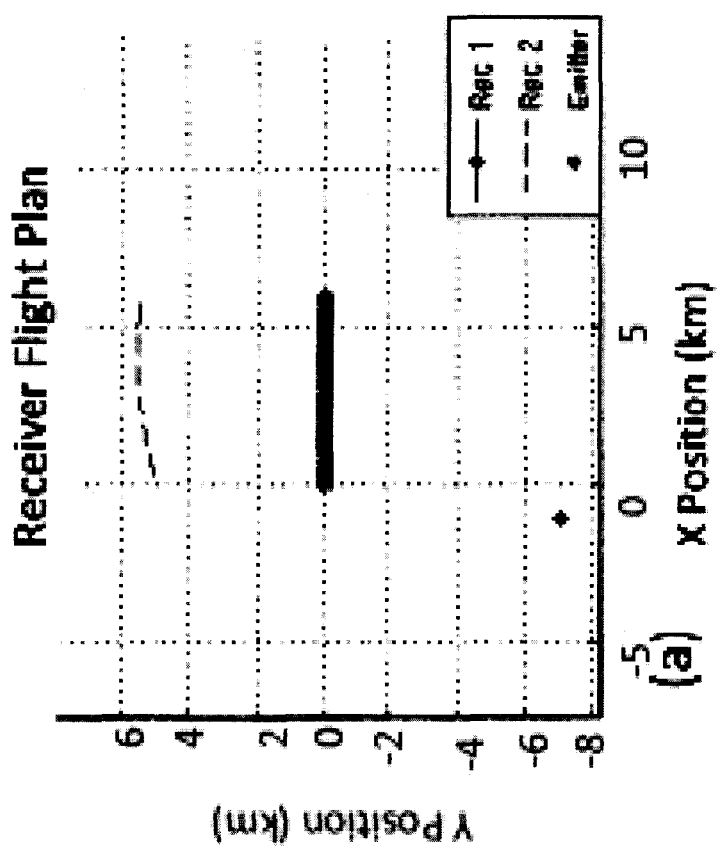
FIGS. 8(a)-8(i) are graphs showing emitter geolocation by minimization of a cost function.
Figure 8B:
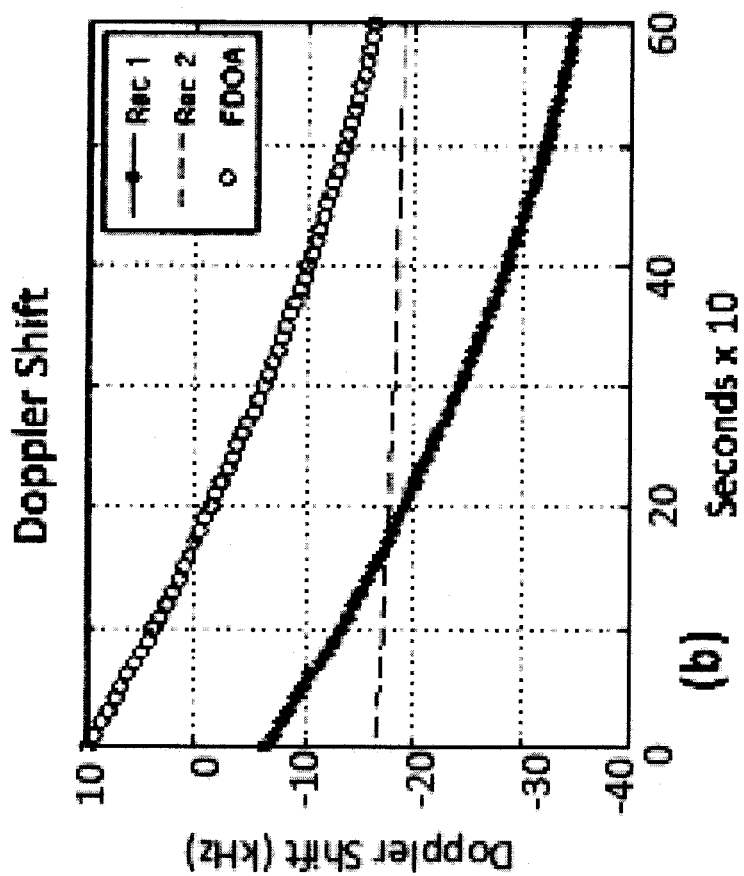
Figure 8C:
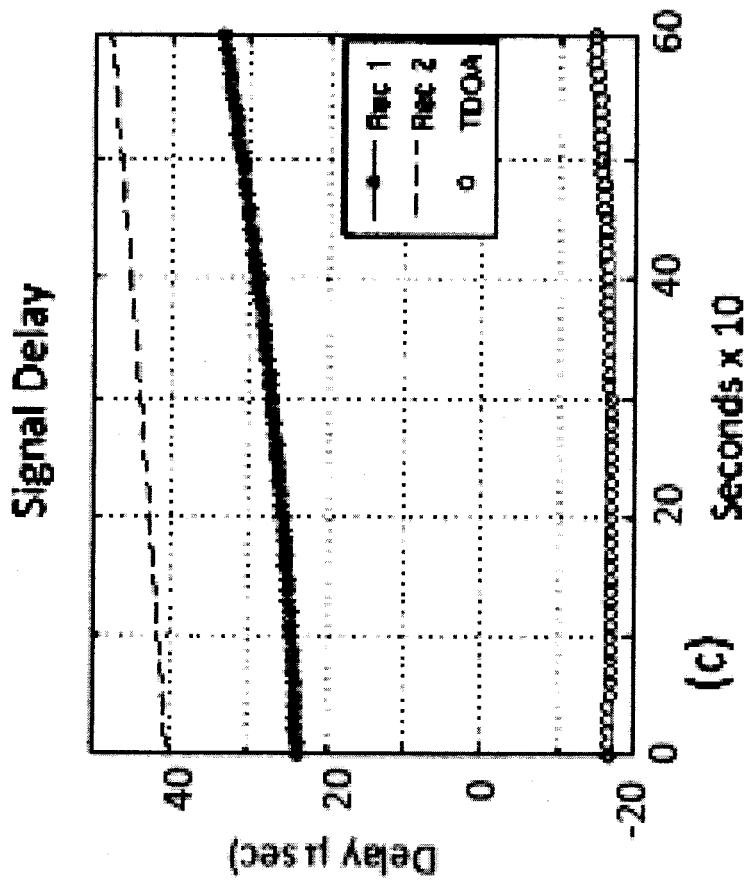
Figure 8D:
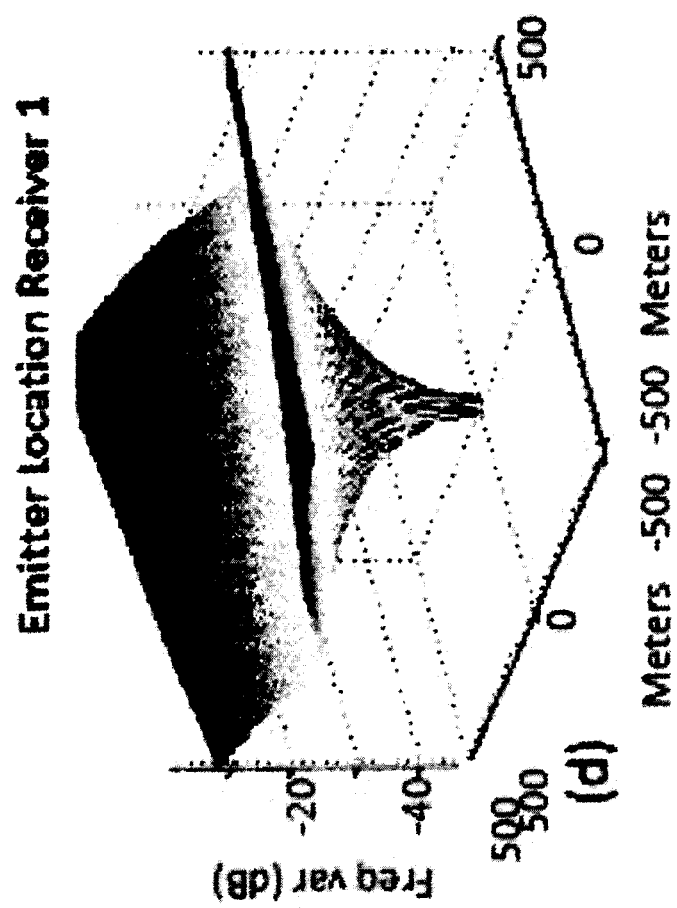
Figure 8E:
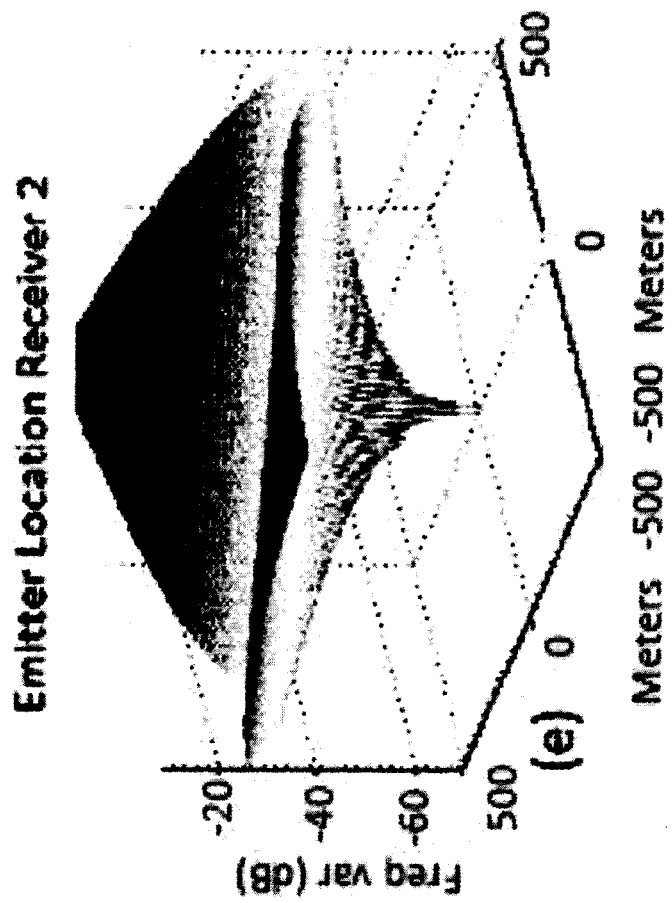
Figure 8F:
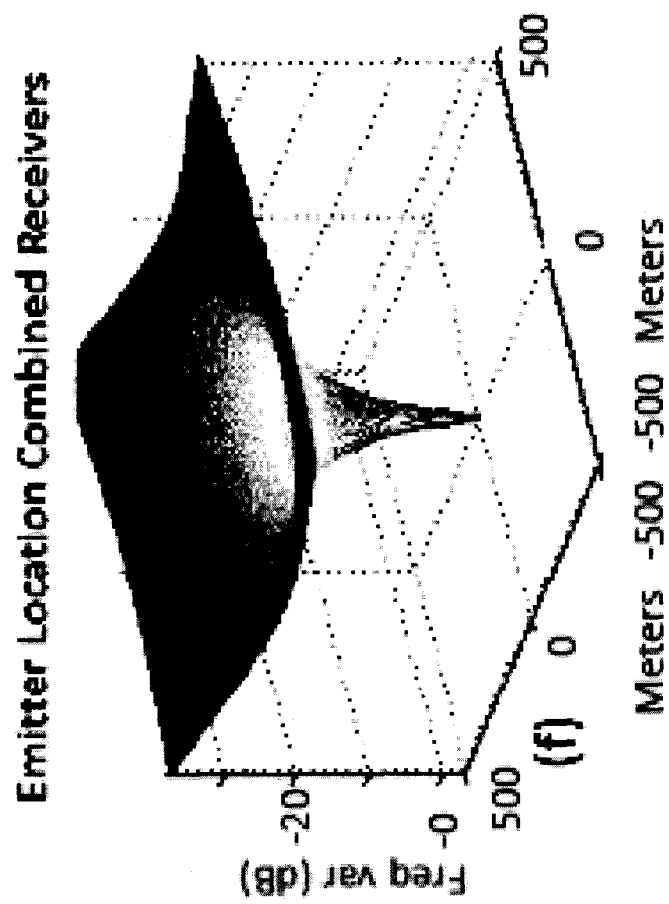
Figure 8G:
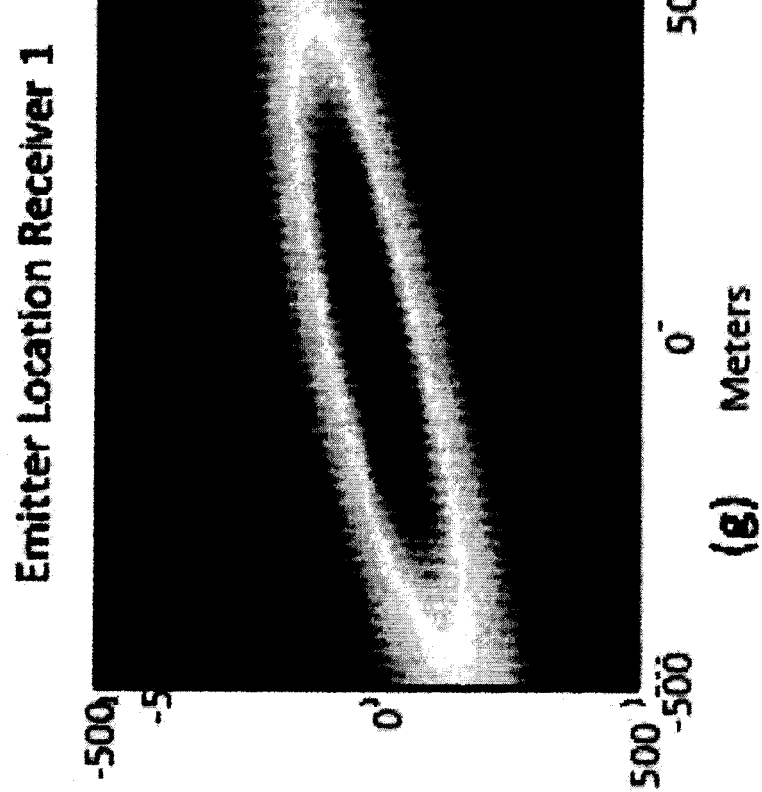
Figure 8H:
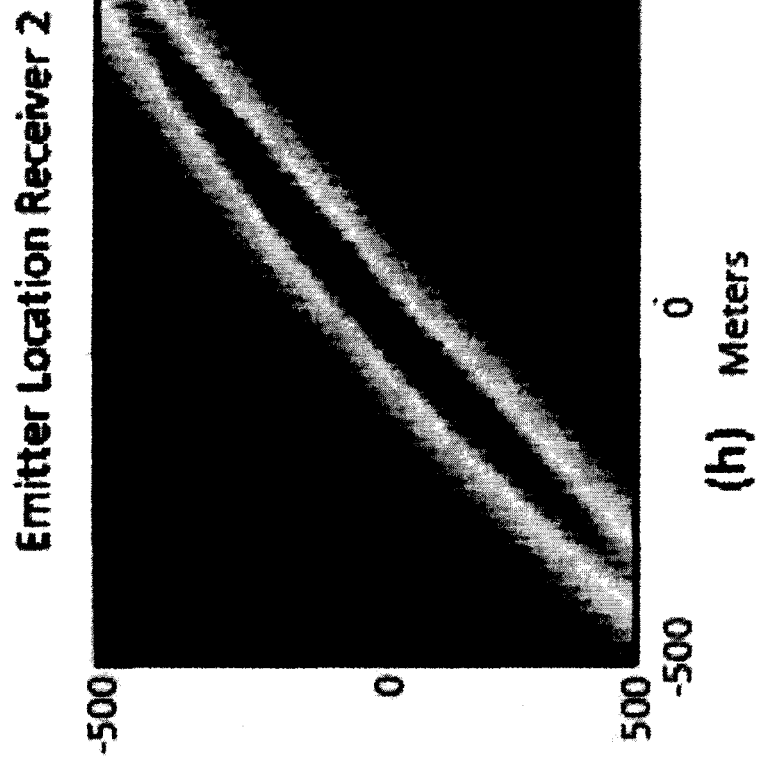
Figure 8I:
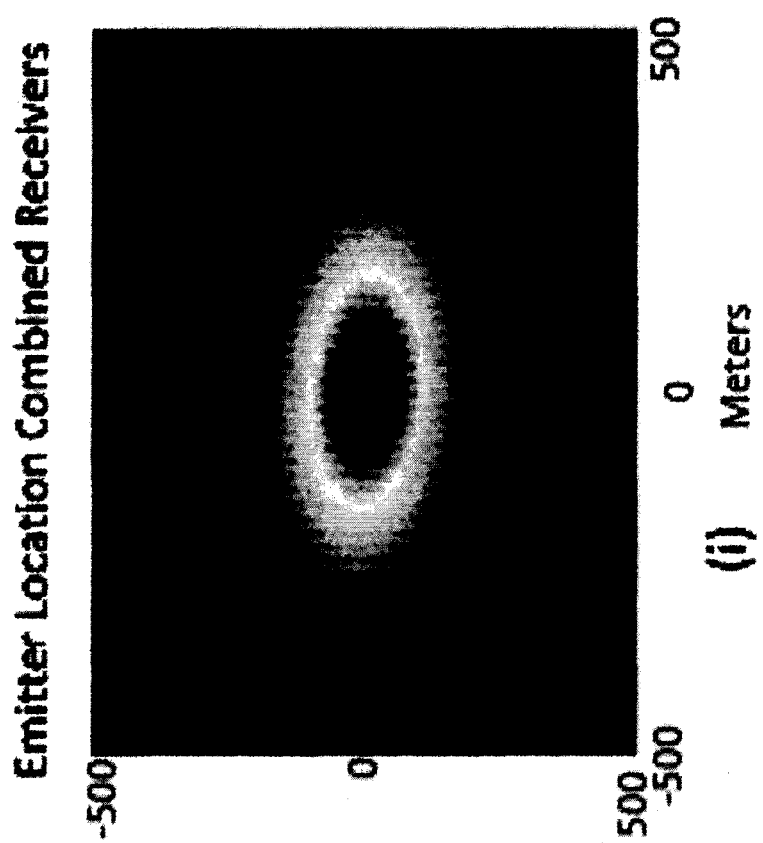

In FIG. 8, FIG. 8(a) shows the relative positions of the two receivers during signal capture, FIG. 8(b) shows the observed Doppler shift and frequency difference of arrival (FDOA) at each receiver as a function of time, and FIG. 8(c) shows the signal delays and time difference of arrival (TDOA) at each receiver as a function of time. FIGS. 8(d) and 8(e) show the values of the log variance of the estimated transmitted frequency over various candidate emitter locations for a 1 kilometer by 1 kilometer grid, based on the signals received at receiver 1 and receiver 2, respectively. In FIG. 8(f), the data from receiver 1 and receiver 2 have been combined to provide a combined calculation. In each of FIGS. 8(d)-8(f), a sharp drop in the log variance may be seen. The geographic location corresponding to this drop also corresponds to the estimated location of the emitter. FIGS. 8(g), 8(h) and 8(i) represent, respectively, the projections of the representations of FIGS. 8(d), 8(e) and 8(f) onto the surface of the earth.

Figure 6:
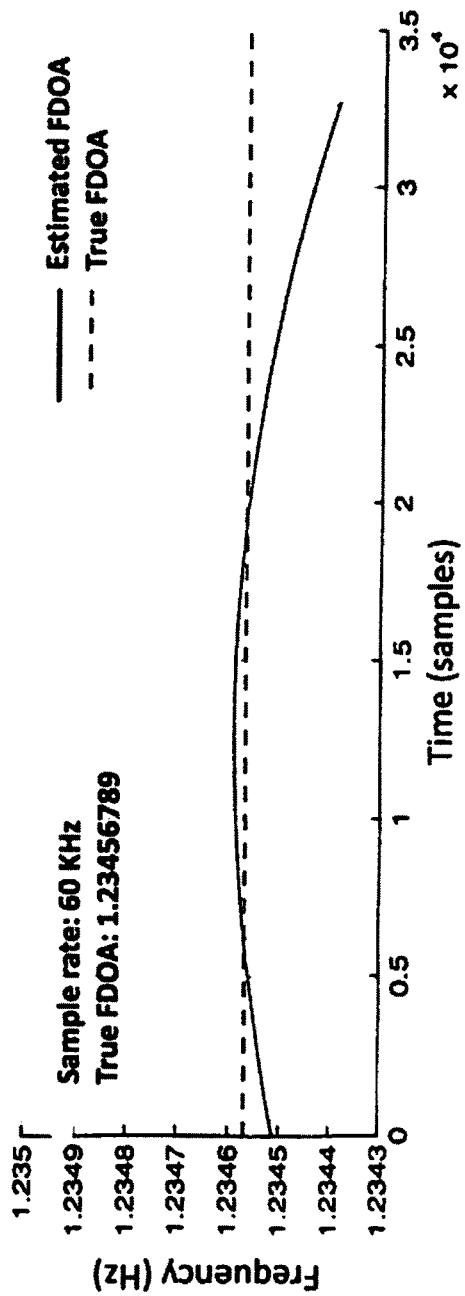
FIG. 6 is a graph showing a frequency difference of arrival (FDOA) and an approximation of the FDOA.

As a further example, the frequency and phase estimation techniques disclosed herein may be used to estimate instantaneous TDOA and FDOA. The values of TDOA and FDOA thus recovered may then be provided to a geolocation engine to perform geolocation according to any of a number of known methods for using TDOA and/or FDOA to perform geolocation. An example of instantaneous FDOA estimated from the derivative of a phase tracking polynomial is shown in FIG. 6. The signal was sampled at a nominal 60 KHz and the true FDOA was 1.23456789 Hz, represented in FIG. 6 by a horizontal line.

Using estimated instantaneous TDOA and FDOA, the signals analysis techniques disclosed herein may be used to perform geolocation with improved accuracy and performance relative to previous techniques, in such a way that makes it relatively simple to upgrade existing geolocation software and/or hardware, as numerous conventional geolocation engines operate on TDOA and FDOA inputs.

Having recovered a polynomial approximation of the received phase of the transmitted signal, an estimate of the TDOA may be generated. To estimate TDOA, the received frequency polynomial, $P(t)$, can be integrated to estimate the received signal phase, $\Phi_r(t)$. The transmitted signal phase can be estimated as $\Phi_e(t)=\omega_e t$. For a first time, $T_0$, a second time, $T_1$, and transmitted frequency, $\omega_e$, TDOA can be estimated as a difference in propagation times from the emitter to the receiver as measured at the observation times, $T_0$ and $T_1$, which can be estimated as in equation 9:

$$TDOA = \frac{\Phi_e(T_1) - \Phi_r(T_1) - \Phi_e(T_0) + \Phi_r(T_0)}{\omega_e} \quad (9)$$

Similarly, FDOA may be estimated using the recovered polynomial approximation of the instantaneous frequency of the received signal. To estimate FDOA, the received signal frequency, $\omega_r(t)$, may be evaluated at a time $T_0$ and another time $T_1$, and FDOA may be computed as the difference, $FDOA=\omega_r(T_1)-\omega_r(T_0)$.

Depending on the embodiment, certain acts, events, or functions of any of the methods described herein can be performed in a different sequence, can be added, merged, or left out all together. Not all described acts or events are necessarily required for the practice of any claimed method. Moreover, in certain embodiments, acts or events can be performed concurrently, e.g., through multi-threaded processing, interrupt processing, or multiple processors or processor cores or on other parallel architectures, rather than sequentially.

The various illustrative logical blocks, modules, and steps described in connection with the embodiments disclosed herein can be implemented as electronic hardware, computer software, or combinations of both. To clearly illustrate this interchangeability of hardware and software, various illustrative components, block, modules, and steps have been described above generally in terms of their functionality. Whether such functionality is implemented as hardware or software depends on the particular application and design constraints imposed on the overall system. The described functionality can be implemented in varying ways for each particular application, but such implementation decisions should not be interpreted as causing a departure from the scope of the disclosure.

The various illustrative logical blocks and modules described in connection with the embodiments disclosed herein can be implemented or performed by a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, but in the alternative, the processor can be a controller, microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration.

The steps of a method or process described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, a DVD-ROM, or any other form of computer-readable storage medium known in the art. An exemplary storage medium can be coupled to the processor such that the processor can read information from, and write information to, the storage medium. In the alternative, the storage medium can be integral to the processor. The processor and the storage medium can reside in an ASIC. The ASIC can reside in a user terminal. In the alternative, the processor and the storage medium can reside as discrete components in a user terminal.

While the above description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments described herein can be embodied within a form that may not provide all of the features and benefits set forth herein, as some features can be used or practiced separately from others. The scope of the invention is indicated by the appended claims rather than the foregoing description. All changes which come within the meaning and range of equivalency of the claims are to be embraced within their scope.

I claim:

1. A computer-implemented method of generating a polynomial approximation of a time-varying carrier frequency of a received signal, the method comprising:
   (A) computing, in a processor of a computing system, a cross-spectral surface of the received signal, wherein the cross-spectral surface is a function of at least time and frequency;
   (B) for each of a first series of times, determining, in the processor an initial frequency estimate to be a point on the cross-spectral surface;
   (C) performing, in the processor, a first polynomial interpolation based on the initial frequency estimates to generate an initial frequency polynomial;
   (D) integrating, in the processor, the initial frequency polynomial to generate an initial phase polynomial;
   (E) processing, in the processor, the received signal to generate a basebanded signal using the initial phase polynomial;
   (F) for each of a second series of times, determining, in the processor, an unwrapped phase value of the basebanded signal;
   (G) performing, in the processor, a second polynomial interpolation based on the unwrapped phase values to generate a residual phase polynomial;
   (H) generating, in the processor, an updated phase polynomial based on the initial phase polynomial and the residual phase polynomial; and
   (I) differentiating, in the processor, the updated phase polynomial to generate the polynomial approximation of the time-varying carrier frequency of the received signal.

2. A method in accordance with claim 1, wherein the cross-spectral surface of the received signal is a product of a first short time Fourier transform of the received signal and a conjugate of a second short time Fourier transform, wherein the second short time Fourier transform is performed on a signal resulting from delaying the received signal.

3. A method in accordance with claim 1, wherein each initial frequency estimate is an argument of a surface component of the cross-spectral surface having a largest magnitude at the time of the first series of times.

4. A method in accordance with claim 1, wherein (E) comprises generating, in the processor, a nominally basebanded signal using the received signal and applying, in the processor, a bandpass filter to the nominally basebanded signal to generate the basebanded signal.

5. A method in accordance with claim 1, the method further comprising performing, in the processor, an iterated phase estimation by iterating over steps (E)-(H), wherein the updated phase polynomial generated in step (H) of a first iteration is used as the initial phase polynomial of a second iteration.

6. A method of geolocating an emitter using the method of claim 1, the method further comprising:
   receiving the signal from the emitter at a moving receiver;
   generating, in the processor, the polynomial approximation of the time-varying carrier frequency of the received signal by performing acts (A)-(I); and
   geolocating the emitter based on the approximated frequency of the received signal.

7. A method in accordance with claim 6, wherein geolocating the emitter based on the approximated frequency comprises solving, in the processor, for a velocity cone angle at a series of observations, wherein the emitter is geolocated at the intersection of the velocity cones.

8. A method in accordance with claim 6, wherein geolocating the emitter based on the approximated frequency comprises minimizing an objective function.

9. A method in accordance with claim 8, wherein the objective function is a variance of the approximated frequency.

10. A method in accordance with claim 8, wherein the objective function is a log variance of the approximated frequency.

11. A method in accordance with claim 8, wherein the minimizing the objective function is performed over a first grid of geographic locations to recover an initial location estimate, the method further comprising minimizing the objective function over a second grid of geographic locations to recover a second location estimate, wherein the second grid is selected based on the initial location estimate.

12. A method in accordance with claim 1, further comprising calculating, in the processor, a propagation time difference based on the approximation of the phase of the received signal.

13. A method in accordance with claim 12, further comprising:
   calculating, in the processor, a frequency difference of arrival based on the polynomial approximation of the time-varying carrier frequency of the received signal; and
   performing geolocation by providing the propagation time difference and the frequency difference of arrival to a geolocation engine.

14. A computer-implemented method of generating a polynomial approximation of a time-varying carrier frequency of a received signal, the method comprising:
   (A) computing, in a processor of a computing system, a cross-spectral surface of the received signal, wherein the cross-spectral surface is a function of at least time and frequency;
   (B) for each of a first series of times, determining, in the processor, an initial frequency estimate to be a point on the cross-spectral surface;

(C) performing, in the processor, a first polynomial interpolation based on the initial frequency estimates to generate an initial frequency polynomial;

(D) integrating, in the processor, the initial frequency polynomial to generate an initial phase polynomial;

(E) processing, in the processor; the received signal to generate a basebanded signal using the initial phase polynomial;

(F) computing, in the processor, a cross-product signal, the cross-product signal being a product of the basebanded signal and a complex conjugate of a delayed version of the basebanded signal;

(G) for each of a second series of times, determining, in the processor, a residual signal frequency value as an argument of the cross-product signal;

(H) performing, in the processor, a second polynomial interpolation based on the residual signal frequency values to generate a residual signal frequency polynomial; and (I) generating, in the processor, the polynomial approximation of the time-varying carrier frequency of the received signal based on the initial frequency polynomial and the residual signal frequency polynomial.

15. A method of geolocating an emitter using the method of claim 14, the method further comprising:
   receiving the signal from the emitter at a moving receiver;
   generating, in the processor, the polynomial approximation of the time-varying carrier frequency of the received signal by performing acts (A)-(I); and
   geolocating the emitter based on the approximated frequency of the received signal.

16. A method in accordance with claim 14, the method further comprising performing, in the processor, an iterated frequency estimation by iterating over steps (D)-(I), wherein the polynomial approximation generated in step (I) of a first iteration is used as the initial frequency polynomial of a second iteration.

17. A method in accordance with claim 14, further comprising integrating, in the processor, the polynomial approximation of the time-varying carrier frequency of the received signal to generate an approximation of a phase of the received signal.

18. A method in accordance with claim 17, further comprising calculating, in the processor, a propagation time difference based on the approximation of the phase of the received signal.

19. A method in accordance with claim 18, further comprising:
   calculating, in the processor, a frequency difference of arrival based on the polynomial approximation of the time-varying carrier frequency of the received signal; and
   performing geolocation by providing the propagation time difference and the frequency difference of arrival to a geolocation engine.

20. A non-transitory computer-readable medium having computer processor-executable instructions stored thereon, wherein execution of the instructions by a computer processor causes the computer processor to:

(A) compute a cross-spectral surface of a received signal, wherein the cross-spectral surface is a function of at least time and frequency;

(B) for each of a first series of times, determine an initial frequency estimate to be a point on the cross-spectral surface;

(C) perform a first polynomial interpolation based on the initial frequency estimates to generate an initial frequency polynomial;

(D) integrate the initial frequency polynomial to generate an initial phase polynomial;

(E) process the received signal to generate a basebanded signal using the initial phase polynomial;

(F) compute a cross-product signal, the cross-product signal being a product of the basebanded signal and a complex conjugate of a delayed version of the basebanded signal;

(G) for each of a second series of times, determine a residual signal frequency value as an argument of the cross-product signal;

(H) perform a second polynomial interpolation based on the residual signal frequency values to generate a residual signal frequency polynomial; and (I) generate the polynomial approximation of the time-varying carrier frequency of the received signal based on the initial frequency polynomial and the residual signal frequency polynomial.

* * * * *